US012130526B2

(12) United States Patent
Kawai

(10) Patent No.: US 12,130,526 B2
(45) Date of Patent: Oct. 29, 2024

(54) DISPLAY DEVICE

(71) Applicant: Japan Display Inc., Tokyo (JP)

(72) Inventor: Kentaro Kawai, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 18/459,444

(22) Filed: Sep. 1, 2023

(65) Prior Publication Data

US 2024/0077774 A1  Mar. 7, 2024

(30) Foreign Application Priority Data

Sep. 6, 2022  (JP) .................................. 2022-141566

(51) Int. Cl.
| G02F 1/1362 | (2006.01) |
| G02F 1/1333 | (2006.01) |
| G02F 1/1334 | (2006.01) |
| G02F 1/1335 | (2006.01) |
| G02F 1/1345 | (2006.01) |
| H01L 27/12 | (2006.01) |

(52) U.S. Cl.
CPC .. *G02F 1/136286* (2013.01); *G02F 1/133357* (2021.01); *G02F 1/1334* (2013.01); *G02F 1/133512* (2013.01); *G02F 1/13452* (2013.01); *G02F 1/136227* (2013.01); *H01L 27/124* (2013.01)

(58) Field of Classification Search
CPC .................................................... G02F 1/1362
See application file for complete search history.

(56) References Cited

U.S. PATENT DOCUMENTS

| 11,112,553 | B2* | 9/2021 | Peng ...................... G02F 1/1336 |
| 11,626,420 | B2* | 4/2023 | Jung .................... H01L 23/5283 |
| | | | 257/314 |
| 2006/0139505 | A1* | 6/2006 | Yoshinaga ............ G02F 1/1345 |
| | | | 349/43 |
| 2012/0162053 | A1* | 6/2012 | Lee ..................... H10K 59/1315 |
| | | | 345/80 |
| 2014/0049453 | A1* | 2/2014 | Lee .................... G02F 1/133512 |
| | | | 345/55 |

(Continued)

FOREIGN PATENT DOCUMENTS

| JP | 2021-092702 A | 6/2021 |
| JP | 2021-092748 A | 6/2021 |

*Primary Examiner* — Sang V Nguyen
(74) *Attorney, Agent, or Firm* — XSENSUS LLP

(57) ABSTRACT

A display device includes an array substrate including a display region arranged with pixels and a peripheral region outside the display region, a counter substrate facing the array substrate, and a liquid crystal layer between the array substrate and the counter substrate. The display region includes a plurality of scanning signal lines extending in a first direction and arranged in a second direction intersecting the first direction, and a plurality of data signal lines extending in the second direction and arranged in the first direction. The peripheral region comprises a first wiring pattern having a first grid pattern formed with a plurality of first wirings connecting the plurality of scanning signal lines and a scanning signal line driver circuit and a plurality of dummy wirings, and a second wiring pattern having a second grid pattern formed with second wirings to be applied with a certain potential.

10 Claims, 11 Drawing Sheets

(56) References Cited

U.S. PATENT DOCUMENTS

| | | | |
|---|---|---|---|
| 2014/0132873 A1* | 5/2014 | Ogasawara | G02F 1/1309 349/43 |
| 2020/0036562 A1* | 1/2020 | Maleki | H04L 27/2647 |
| 2022/0283462 A1* | 9/2022 | Ohue | G02F 1/1345 |
| 2022/0299807 A1 | 9/2022 | Ohue | |

* cited by examiner

DISPLAY DEVICE

CROSS-REFERENCE TO RELATED APPLICATION

This application claims the benefit of priority to Japanese Patent Application No. 2022-141566, filed on Sep. 6, 2022, the entire contents of which are incorporated herein by reference.

FIELD

An embodiment of the present invention relates to a wiring structure for a display device.

BACKGROUND

As liquid crystal displays, there are known transmission-type displays that display images by transmitting light from a backlight arranged behind a liquid crystal panel, reflection-type displays that display images by reflecting outside light through pixel electrodes, and semi-transmissive displays that combine the features of both transmission and reflection types. These liquid crystal displays are used as displays in personal computers, smartphones, and other electronic devices, and have a configuration where the background cannot be seen through the screen.

In contrast, a display device that allows the back to be visible while displaying an image has been developed. For example, there is a display device in which the display region is configured by a polymer-dispersed liquid crystal arranged between a pair of translucent substrates, and the back can be seen through the screen.

A display device in which the back is visible can enhance its design by making not only the display region but also the peripheral region outside the display region (also called frame region) transparent. However, there can be a difference in transparency between the display region where pixels are arranged and the peripheral region where wiring is arranged.

SUMMARY

A display device in an embodiment according to the present invention includes an array substrate including a display region arranged with pixels and a peripheral region outside the display region, a counter substrate facing the array substrate, and a liquid crystal layer between the array substrate and the counter substrate. The display region includes a plurality of scanning signal lines extending in a first direction and arranged in a second direction intersecting the first direction, and a plurality of data signal lines extending in the second direction and arranged in the first direction. The peripheral region comprises a first wiring pattern having a first grid pattern formed with a plurality of first wirings connecting the plurality of scanning signal lines and a scanning signal line driver circuit and a plurality of dummy wirings, and a second wiring pattern having a second grid pattern formed with second wirings to be applied with a certain potential.

DESCRIPTION OF EMBODIMENTS

Hereinafter, embodiments of the present invention are described with reference to the drawings. However, the present invention can be implemented in many different aspects, and should not be construed as being limited to the description of the following embodiments. For the sake of clarifying the explanation, the drawings may be expressed schematically with respect to the width, thickness, shape, and the like of each part compared to the actual aspect, but this is only an example and does not limit the interpretation of the present invention. For this specification and each drawing, elements similar to those described previously with respect to previous drawings may be given the same reference sign (or a number followed by A, B, a, b, etc.) and a detailed description may be omitted as appropriate. The terms "first" and "second" appended to each element are a convenience sign used to distinguish them and have no further meaning except as otherwise explained.

As used herein, where a member or region is "on" (or "below") another member or region, this includes cases where it is not only directly on (or just under) the other member or region but also above (or below) the other member or region, unless otherwise specified. That is, it includes the case where another component is included in between above (or below) other members or regions.

First Embodiment

A display device 100 according to the first embodiment of the present invention will be described with reference to the drawings.

1-1. Outline of Display Device

Figure 1:
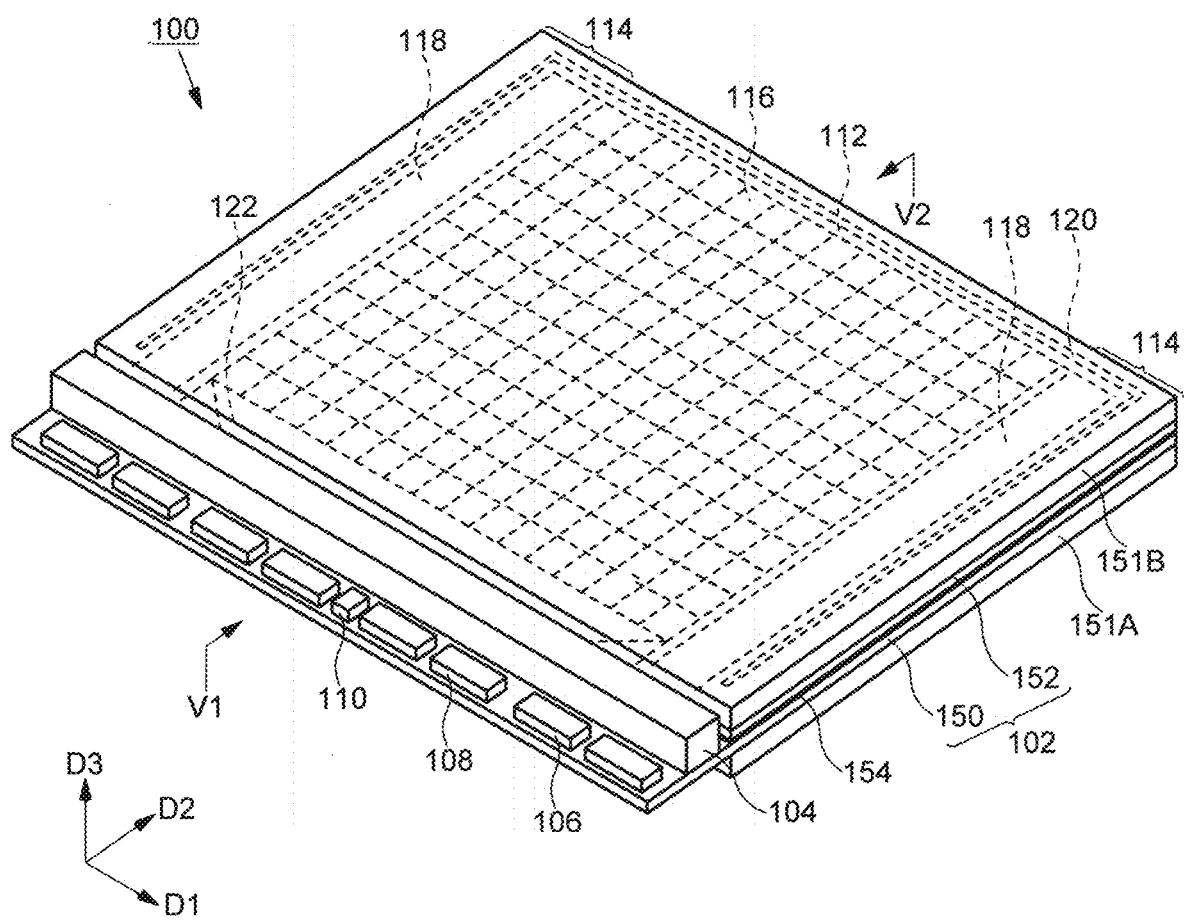
FIG. 1 is a diagram showing a configuration of a display device according to an embodiment of the present invention.

FIG. 1 shows a diagram of the display device 100 according to an embodiment of the present invention. The display device 100 includes a display panel 102, a light source 104, a first transparent substrate 151A and a second transparent substrate 151B that sandwich the display panel 102. The display panel 102 includes an array substrate 150, a counter substrate 152, and a liquid crystal layer (not shown) between the array substrate 150 and the counter substrate 152. The display panel 102 has a display region 112 and a peripheral region 114, a plurality of pixels 116 are arranged in the display region 112, and a driver circuit such as a scanning signal line driver circuit 106 and data signal line driver circuit 108, a first wiring pattern 118, a second wiring pattern 120, and the like are arranged in the peripheral region 114.

In the following description, one direction when the display panel 102 is viewed in a plan view is defined as direction D1, the direction orthogonal to the direction D1 is defined as direction D2, and the direction orthogonal to the plane D1-D2 is defined as direction D3.

The array substrate 150 and the counter substrate 152 have translucency. The array substrate 150 and the counter substrate 152 are preferably transparent to visible light. The counter substrate 152 is arranged in the direction D3 opposite the array substrate 150. The array substrate 150 and the counter substrate 152 are arranged opposite each other with a gap between them and are fixed by the sealant 154. The array substrate 150 and the counter substrate 152 have a gap, and a liquid crystal layer, not shown, is arranged in the gap.

The display region 112 has a plurality of pixels 116 arranged in the direction D1 (row direction) and in the direction D2 (column direction). For example, m pixels are arranged along the direction D1, and n pixels are arranged along the direction D2 in the display region 112. The number of the plurality of pixels 116 (the numbers of m and n) are set appropriately according to the vertical and horizontal display resolutions. The display region 112 has scanning signal lines extending in the direction D1 and data signal lines extending in the direction D2 along the direction D1.

The scanning signal line driver circuit 106 and the data signal line driver circuit 108 are arranged in the peripheral region 114 of the array substrate 150. FIG. 1 shows an aspect in which the scanning signal line driver circuit 106 and the data signal line driver circuit 108 are arranged in an integrated circuit (IC) and are mounted on the array substrate 150 in a COG (Chip on Glass) method. The scanning signal line driver circuit 106 and data signal line driver circuit 108 may be implemented in a COF (Chip on Film) method or formed by thin-film transistors (TFTs) on the array substrate 150, without being limited to the aspect shown in the figure.

The peripheral region 114 includes a first wiring pattern 118, a second wiring pattern 120, and a third wiring pattern 122. The first wiring pattern 118 is formed by first wirings that connect the scanning signal line driver circuit 106 and scanning signal lines 107 (refer to FIG. 3) that are arranged in the display region 112. The second wiring pattern 120 is formed by second wirings that surround the outside of the display region 112. The second wirings can be called the common wirings since a constant voltage (common voltage) is applied to them. The second wirings are also used as wiring to apply a common voltage to the counter electrode 162 (refer to FIG. 5) arranged on the counter substrate 152. The third wiring pattern 122 is formed by third wirings that connects the data signal line driver circuit 108 and the data signal lines 109 (refer to FIG. 3), which is arranged in the display region 112.

The light source 104 has a structure along the direction D1. The light source 104 is configured, for example, with light emitting diodes (LED: Light Emitting Diode) arrayed along the direction D1. The detailed structure of the light source 104 is not limited and may include optical components such as reflectors, diffusers, and lenses in addition to the light emitting diodes arrayed in the direction of D1. The light source 104 and a light emission control circuit 110 that controls the light source 104 may be arranged as a separate component independent of the display panel 102. The light source 104 may have its light emission timing controlled by the light emission control circuit 110 that is synchronized with the scanning signal line driver circuit 106 and the data signal line driver circuit 108. The light emission control circuit 110 that controls the light source 104 may be installed as a separate component from the display panel 102, just like the light source 104, may be mounted on the array substrate 150 as a separate component, or may be installed in the scanning signal line driver circuit 106 or the data signal line driver circuit 108. The light source 104 arranged along the direction of D1 has light incident from the side of the second transparent substrate 151B (or the first transparent substrate 151A) and propagates the light toward the direction D2.

The first transparent substrate 151A and the second transparent substrate 151B are arranged between the display region 112 and the peripheral region 114. The first transparent substrate 151A and the second transparent substrate 151B have a function as protective members for the display panel 102. As will be explained with reference to FIG. 2, the first transparent substrate 151A and the second transparent substrate 151B have a function as light guide plates that guide light emitted from the light source 104 into the display panel 102.

Figure 2:
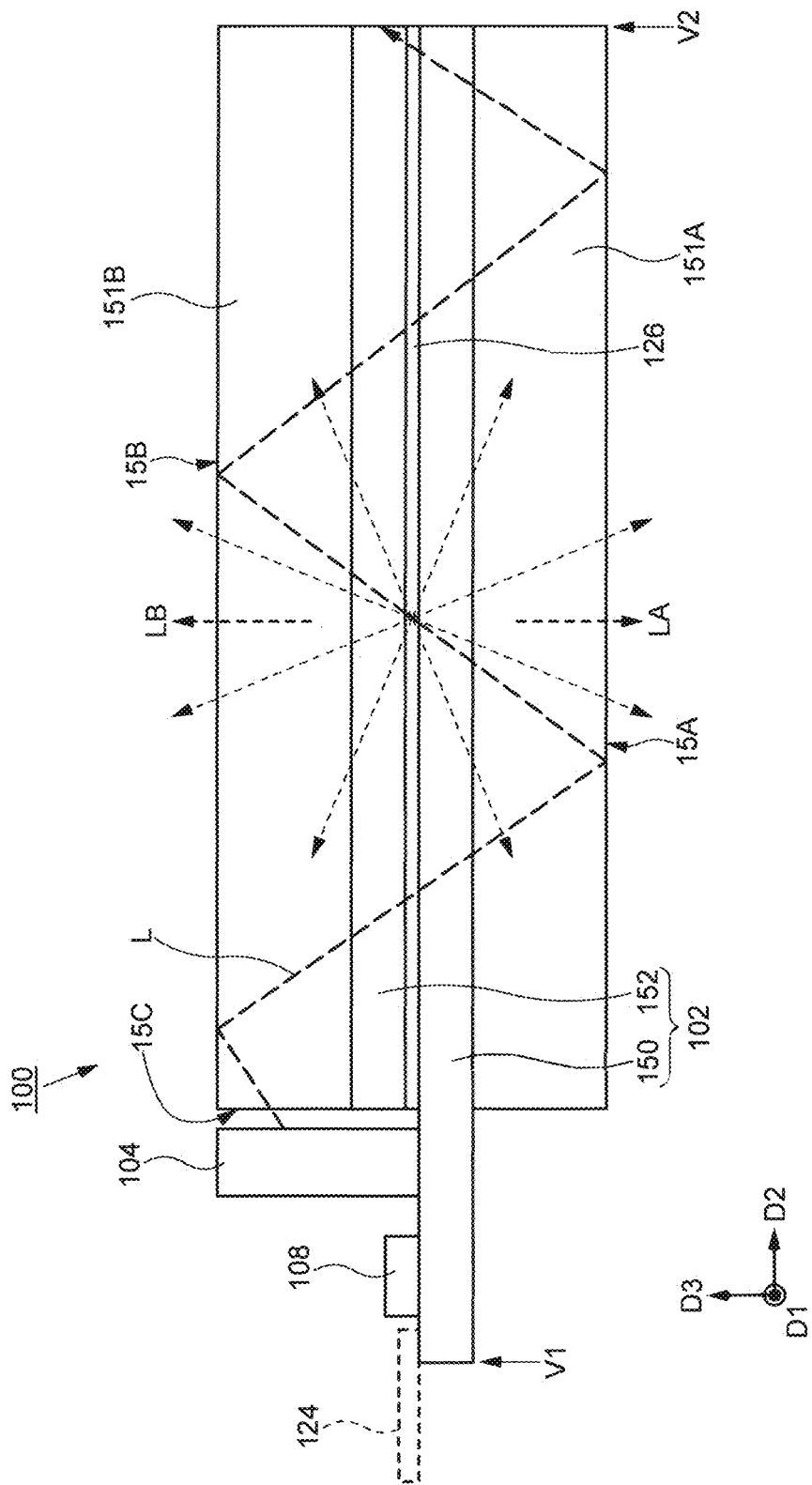
FIG. 2 is a cross-sectional schematic diagram showing the structure corresponding to the space between V1-V2 of the display device shown in FIG. 1.

FIG. 2 shows a cross-sectional structure of the display device 100 corresponding to the section between V1-V2 shown in FIG. 1. As shown in FIG. 2, the first transparent substrate 151A and the second transparent substrate 151B are arranged to sandwich the display panel 102. The first transparent substrate 151A is arranged on the array substrate 150 side and the second transparent substrate 151B is arranged on the counter substrate 152 side. A glass substrate or a plastic substrate is used as the first transparent substrate 151A and the second transparent substrate 151B. The first transparent substrate 151A and the second transparent substrate 151B have transparency and it is preferred that they have a refractive index equivalent to that of the array substrate 150 and the counter substrate 152. The array substrate 150 and the first transparent substrate 151A, and the counter substrate 152 and the second transparent substrate 151B are bonded by a transparent adhesive which is not shown.

The array substrate 150 is larger than the counter substrate 152 in a plan view, and a portion of the peripheral region 114 is exposed from the counter substrate 152. The driver circuits are arranged in this exposed region. FIG. 2 shows a configuration in which a data signal line driver circuit 108 is arranged as one of the driver circuits. Terminals which are not shown are arranged in the peripheral region 114, and a flexible wiring substrate 124 is attached to the peripheral region 114. The light source 104 is arranged adjacent to one side of the first transparent substrate 151A or the second transparent substrate 151B. FIG. 2 shows a configuration in which the light source 104 is arranged adjacent to a first side 15C of the second transparent substrate 151B. The light source 104 is sometimes referred to as a side light source because it emits light L toward the first side 15C. FIG. 2 shows a configuration in which the light source 104 is mounted on the array substrate 150, but there is no limitation on the configuration in which the light source 104 is arranged, and there is no limitation on the mounting structure as long as the mounting position can be fixed. The light source 104 may be supported, for example, by an enclosure surrounding the display panel 102.

As shown in FIG. 2, light emitted from the light source 104 enters the second transparent substrate 151B from the first side 15C. The first side 15C of the second transparent substrate 151B, which is counter substrate to the light source 104, is the light-entering surface.

As shown schematically in FIG. 2, light L incident from the first side 15C of the second transparent substrate 151B enters the display panel 102 and further propagates in a direction away from the first side 15C (direction D2) while being reflected by a first plane 15A of the first transparent substrate 151A and a second plane 15B of the second transparent substrate 151B. When light L travels outward from the first plane 15A of the first transparent substrate 151A and the second plane 15B of the second transparent substrate 151B, it will travel from a medium with a large refractive index to a medium with a small refractive index. When the angle of incidence of light L incident on the first plane 15A and the second plane 15B is larger than the critical angle, the light will be totally reflected and will be guided in the direction D2 while being reflected by the first plane 15A and the second plane 15B.

The liquid crystal layer 126 is formed of polymer-dispersed liquid crystal. The liquid crystal layer 126, which is formed of polymer-dispersive liquid crystal, is controlled to be in a scattering state and a non-scattering state for each pixel 116 (refer to FIG. 1). As shown in FIG. 2, light L propagating while being reflected in the first plane 15A and the second plane 15B is scattered at least partially when there is a pixel where the liquid crystal layer 126 is in a scattering state, when the incident angle of the scattered light becomes smaller than the critical angle, the scattered light LA and LB are emitted outward from the first plane 15A and the second plane 15B, respectively, and the emitted scattered light LA and LB are observed by an observer. Other than the regions where scattered light LA and LB are emitted, the array substrate 150 and counter substrate 152, as well as the first transparent substrate 151A and second transparent substrate 151B are translucent (transparent to visible light), and the liquid crystal layer 126 is in the non-scattering state, so it is substantially transparent, and the observer can see through the display panel 102 to the back side of the panel.

1-2. Configuration of Array Substrate

Figure 3:
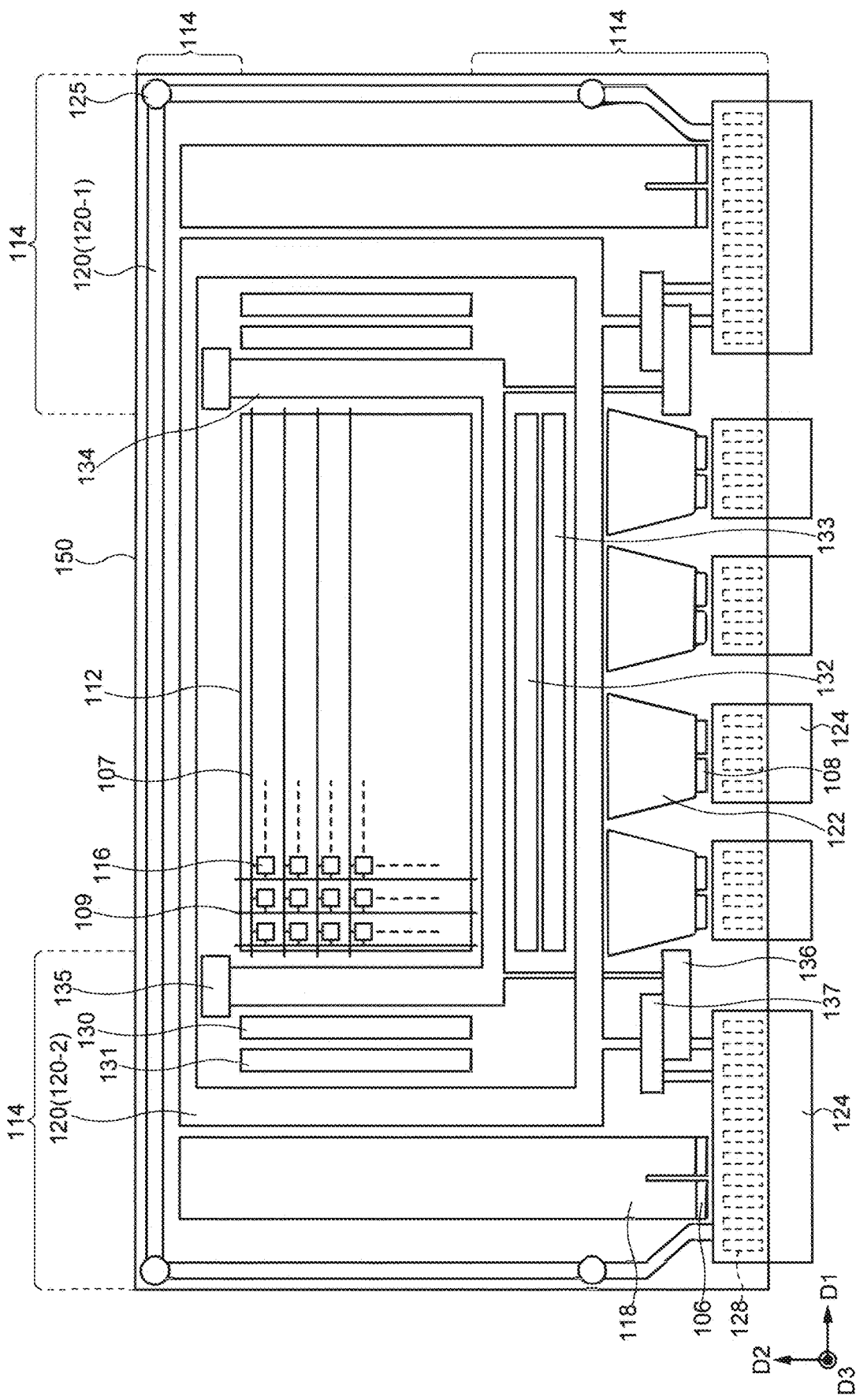
FIG. 3 is a diagram showing a configuration of the array substrate of a display device according to an embodiment of the present invention.

FIG. 3 is a plan view of the array substrate 150 to illustrate its configuration. The array substrate 150 includes a display region 112 and a peripheral region 114. The display region 112 has a plurality of pixels 116 arranged in a matrix. Although not shown, each of the plurality of pixels 116 includes a pixel electrode, a transistor connected to the pixel electrode, a counter electrode, and a liquid crystal layer. The plurality of scanning signal lines 107 extending in the direction D1 are arranged in the display region 112 in the direction D2, and the plurality of data signal lines 109 extending in the direction D1 are arranged in the display region 112 in the direction D2.

The scanning signal line driver circuit 106 and the data signal line driver circuit 108 are arranged in the peripheral region 114. The first wiring pattern 118 formed by the plurality of first wirings extending from the scanning signal line driver circuit 106 to the display region 112, the second wiring pattern 120 formed by second wirings to which a constant voltage (common voltage) is applied, and the third wiring pattern 122 formed by the plurality of third wirings extending from the data signal line driver circuit 108 to the display region 112 are arranged in the peripheral region 114.

The second wiring patterns 120 (120-1, 120-2), common pads 125, and scanning signal line inspection circuit 130, data signal line inspection circuit 132, and a plurality of terminals 128 for inputting signals from external circuit are arranged in the peripheral region 114. The plurality of terminals 128 are arranged along the direction D1 at the periphery part of the array substrate 150. A flexible wiring substrate 124 is attached to the plurality of terminals 128. The scanning signal line driver circuit 106, the second wiring patterns 120 (120-1, 120-2), the ESD protection circuit 137, and the QD pads 136 are electrically connected to the flexible wiring substrate 124.

The scanning signal line driver circuit 106 is connected to the plurality of scanning signal lines 107 via the plurality of first wirings forming the first wiring pattern 118. Each of the plurality of scanning signal lines 107 is electrically connected to each of the plurality of pixels 116 in the display region 112. The number of the plurality of first wirings forming the first wiring pattern 118 corresponds to the number of scanning signal lines 107 connected to the scanning signal line driver circuit 106. In FIG. 3, the first wiring pattern 118 is shown as being separated from the display region 112, but is actually continuous so as to be connected to the scanning signal lines 107.

The data signal line driver circuit 108 is connected to the plurality of data signal lines 109. Each of the plurality of data signal lines 109 is electrically connected to each of the plurality of pixels 116 in the display region 112. In FIG. 3, the third wiring pattern 122 is shown as being separated from the display region 112 to connect the data signal line driver circuit 108 and the plurality of data signal lines 109, but is actually continuous so as to connect to the data signal lines 109.

Although not shown in FIG. 3 in detail, the plurality of first wirings forming the first wiring pattern 118 extend in the direction D2 from the scanning signal line driver circuit 106 and bend midway in the direction D1 before connecting to the scanning signal line 107. In the region where the first wirings are arranged, dummy wirings are arranged between the wirings.

The second wiring pattern 120-2, an ESD protection circuit 131, a scanning signal line inspection circuit 130, and inspection lines 134 are arranged between the first wiring pattern 118 and the display region 112. The second wiring pattern 120-2, an ESD protection circuit 133, a data signal line inspection circuit 132, and inspection lines 134 are arranged between the third wiring pattern 122 and the display region 112. The inspection lines 134 are connected to the ESD protection circuit 135 and the QD pads 136. The second wiring pattern 120-2 is connected to the ESD protection circuit 137. The second wiring pattern 120-1 is arranged to surround the peripheral region 114 in the array substrate 150, and signals are supplied from the flexible wiring substrate 124.

1-3. Configuration of Counter Substrate

Figure 4:
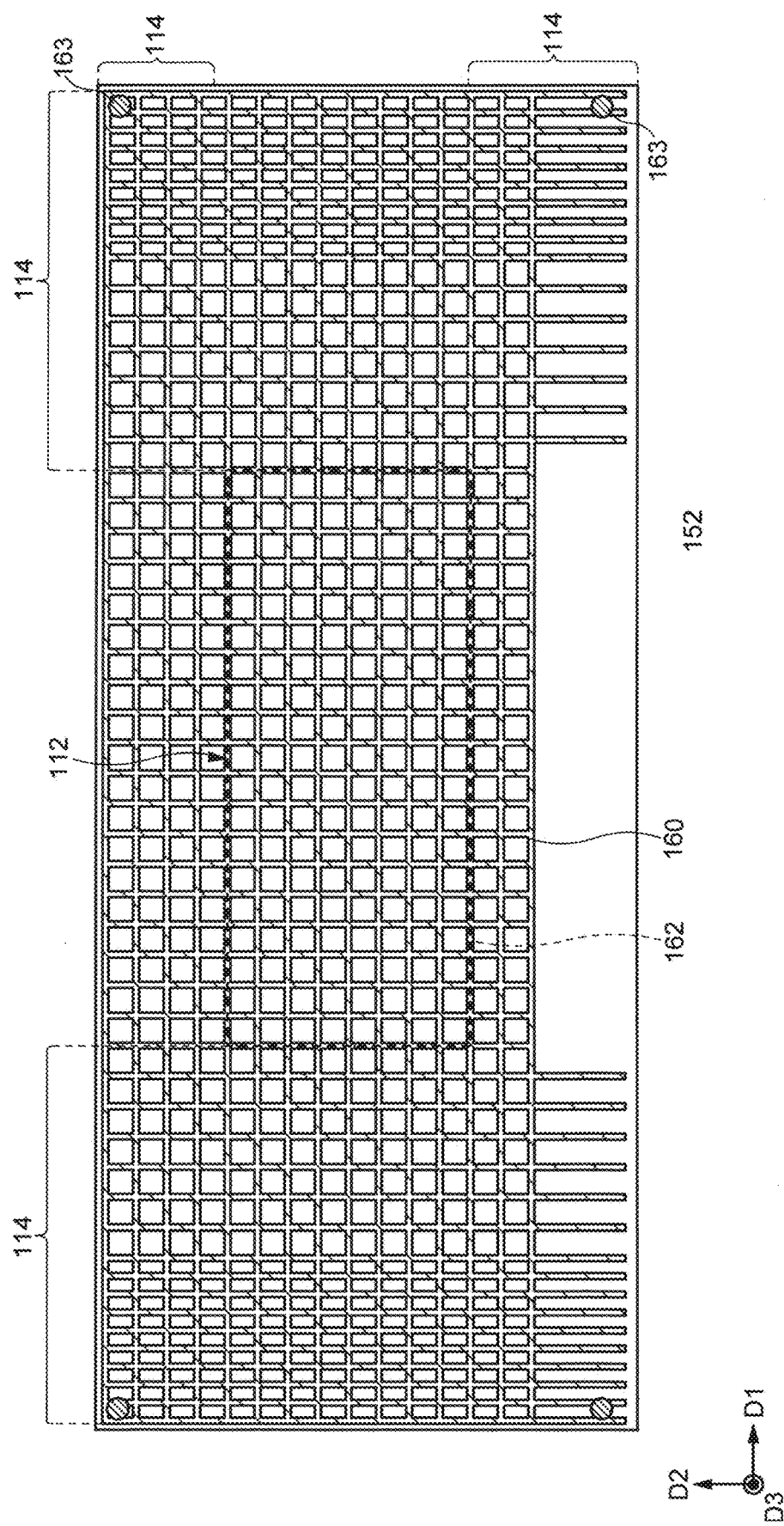
FIG. 4 is a plan view of a configuration of a light shielding layer in a display device according to an embodiment of the present invention.

FIG. 4 is a plan view of the configuration of the counter substrate 152. As shown in FIG. 4, a light shielding layer 160 and the counter electrode 162 are arranged on the counter substrate 152. The light shielding layer 160 is arranged in the display region 112 and the peripheral region 114. The counter electrode 162 is arranged in the display region 112. The counter electrode 162 may be arranged to extend not only to the display region 112 but also to the peripheral region 114.

The light shielding layer 160 has a grid pattern that overlaps the scanning signal lines 107 and data signal lines 109 in the display region 112. That is, the light shielding layer 160 has a pattern that opens the transparent regions of the pixels 116 and covers the regions overlapping the wiring where transmitted light is blocked. The pixels 116 are periodically arranged in a matrix-like pattern in the display region 112. The light shielding layer 160 has a periodic pattern in the form of a grid overlapping the scanning signal lines and data signal lines.

The light shielding layer 160 has a first grid pattern 160A in the display region 112 and a second grid pattern 160B in the peripheral region 114. In addition, as described later (refer to FIG. 6A), the first wiring pattern 118 and the second wiring pattern 120 are arranged in a third grid pattern 127. Since the density of the wirings of the first wiring pattern 118 is higher than the density of the wirings of the scanning signal lines 107 and the data signal lines 109 in the display region 112, the first grid pattern 160A or the second grid pattern 160B of the light shielding layer 160 in the region overlapping the first wiring pattern 118 is denser than that in the region overlapping the display region 112. Since the density of the wirings of the first wiring pattern 118 is higher than the density of the wirings of the scanning signal lines 107 and the data signal lines 109 in the display region 112, the first grid pattern 160A or the second grid pattern 160B of the light shielding layer 160 in the region overlapping the first wiring pattern 118 is denser than that of the grid pattern in the region overlapping the display region 112. In other words, since an interval between wirings of the first wiring pattern 118 is narrower than an interval between wirings of the scanning signal lines 107 and data signal lines 109 in the display region 112, the first grid pattern 160A or the second grid pattern 160B of the light shielding layer 160 in the region overlapping the first wiring pattern 118 has a smaller grid size than that in the region overlapping the display region 112.

Since the light shielding layer 160 has a grid pattern so that it is continuous from the display region 112 to the peripheral region 114, it is possible to make the entire display panel 102 have the same level of transmittance, so that the boundary between the display region 112 and the peripheral region 114 is not visible. As a result, even when the display panel 102 is used as a display device that can be seen through to the back (transparent display), the boundary between the display region 112 and peripheral region 114 can be prevented from being seen, so that the overall transparency of the display panel 102 does not look uncomfortable.

The light shielding layer 160 is formed of a black resin material or metal material. The light shielding layer 160 is formed in contact with the counter electrode 162 (refer to FIG. 5). It is possible to have the light shielding layer 160 function as an auxiliary electrode to reduce resistance loss by forming the light shielding layer 160 with a metallic material in contrast to the counter electrode 162, which is formed with a transparent conductive layer. As a metallic material to form the light shielding layer 160, it is preferable to use chromium, molybdenum, titanium, etc., which have relatively low reflectivity compared to aluminum.

Common pads 163 are arranged on the counter substrate 152. The common pads 163 are formed in the same layer as the light shielding layer 160 and are arranged to conduct with the light shielding layer 160. The common pads 163 are arranged at a position overlapping the common pads 125 of the array substrate 150. The display panel 102 is cell-assembled so that the common pads 125 on the array substrate 150 side and the common pads 163 on the counter substrate 152 side are conductive. As a result, a common voltage is applied from the array substrate 150 to the counter electrode 162. The common pads 125 and the common pads 163 are arranged at the periphery of the panel. The light shielding layer 160 has a function as a wiring connecting the common pads 163 and the counter electrode 162. The light shielding layer 160 has a second grid pattern to reduce the wiring resistance.

1-4. Cross-Sectional Structure of Pixel

Figure 5:
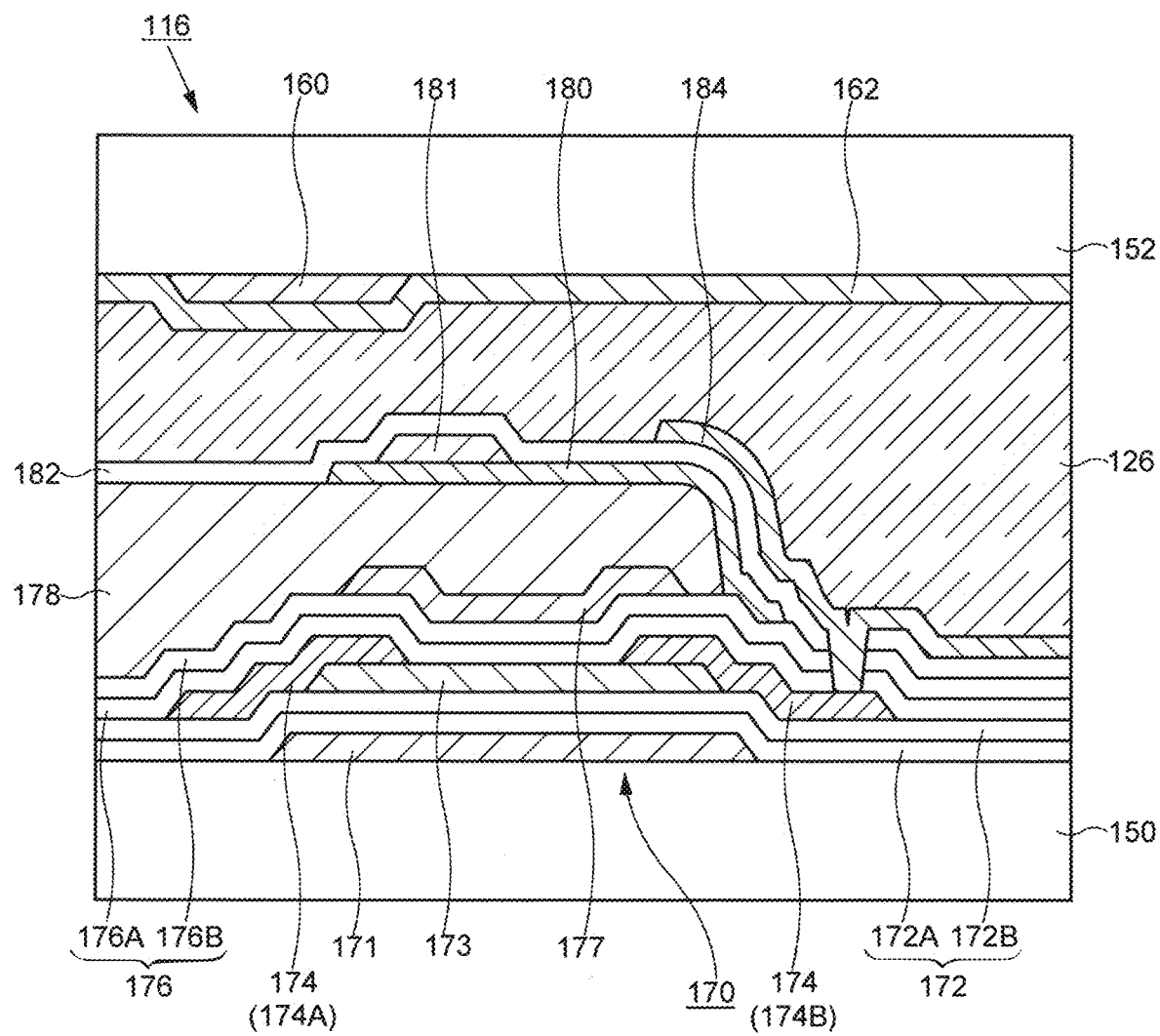
FIG. 5 is a cross-sectional view of a pixel structure in a display device according to an embodiment of the present invention.

FIG. 5 shows the cross-sectional structure of a pixel 116. As shown in FIG. 5, a transistor 170 is arranged on the array substrate 150. The transistor 170 includes a first conductive layer 171 as a gate electrode, a first insulating layer 172, a semiconductor layer 173, and a second conductive layer 174 forming a source electrode 174A and a drain electrode 174B. The first insulating layer 172 is interposed between the first conductive layer 171 and the semiconductor layer 173 and functions as a gate insulating layer. The semiconductor layer 173 is formed of, for example, an oxide semiconductor. The source electrode 174A is connected to the data signal line 109, and the drain electrode 174B is connected to a second transparent conductive layer 184 as the pixel electrode. The first conductive layer 171 is formed of the same layer as the conductive layer forming the scanning signal lines 107, and the source electrode 174A and drain electrode 174B are formed of the conductive layer forming the data signal lines 109. The first insulating layer 172 may have a single-layer structure or may have a structure in which multiple insulating layers are stacked. For example, the first insulating layer 172 may have a structure in which a silicon nitride layer 172A and a silicon oxide layer 172B are stacked.

FIG. 5 shows an example of a bottom-gate type (also called reverse staggered) structure in which the transistor 170 has a first conductive layer 171 as a gate electrode, a first insulating layer 172 as a gate insulating layer, and a semiconductor layer 173 stacked from the side of the array substrate 150, with the source electrode 174A and the drain electrode 174B arranged across the semiconductor layer 173. The transistor 170 that can be used for the pixel 116 is not limited to the structure shown in FIG. 5, and a top-gate type structure can also be applied.

A second insulating layer 176 is arranged over the transistor 170. The second insulating layer 176 is arranged as a passivation layer. The second insulating layer 176 may have a single-layer structure or may have a structure in which multiple insulating layers are stacked. For example, the second insulating layer 176 may have a structure in which a silicon oxide layer 176A and a silicon nitride layer 176B are stacked. A third conductive layer 177 may be arranged on the second insulating layer 176 in a region overlapping the semiconductor layer 173. The third conductive layer 177 is used as a light shielding layer for the semiconductor layer 173 and is used as a back gate electrode when a certain potential is applied.

A planarization layer 178 is arranged on the second insulating layer 176 and the third conductive layer 177. The planarization layer 178 is a transparent organic insulating layer composed of an organic material such as acrylic, and is arranged to reduce unevenness caused by various components such as the first conductive layer 171, semiconductor layer 173, source electrode 174A, and drain electrode 174B that configure the transistor 170.

As shown in FIG. 5, a first transparent conductive layer 180 is arranged from the top of the planarization layer 178 to the side surface (the stepped portion where the planarization layer 178 has been removed). A fourth conductive layer 181 is arranged in a part of a region above the first transparent conductive layer 180. The first transparent conductive layer 180 is used as a capacitance electrode and the fourth conductive layer 181 is used as capacitance wiring. The second transparent conductive layer 184 forms the pixel electrode. The second transparent conductive layer 184 as the pixel electrode is connected to the drain electrode 174B through a contact hole formed in the second insulating layer 176. A third insulating layer 182 is arranged to cover the first transparent conductive layer 180 and the fourth conductive layer 181 and to cover the planarization layer 178 and the second insulating layer 176 exposed from the planarization layer 178. The third insulating layer 182 is formed of an inorganic insulating material such as silicon nitride. A holding capacitance is formed in the region where the second transparent conductive layer 184 and the first transparent conductive layer 180 overlap through the third insulating layer 182. A first alignment film (not shown) is formed to cover the pixel electrode (second transparent conductive layer 184) and the third insulating layer 182 in the array substrate 150.

The planarization layer 178 may be removed in the region where the second transparent conductive layer 184 is arranged in order to increase transparency in the display device 100, through which the back can be seen. This reduces light absorption by the planarization layer 178 and increases transparency. FIG. 5 shows a structure in which the planarization layer 178 is arranged in the region overlapping the transistor 170 and the planarization layer 178 is removed in the region where the second transparent conductive layer forming the pixel electrode is arranged outside the transistor 170. The region outside the transistor 170 has a structure in which the second insulating layer 176 is exposed from the planarization layer 178.

The counter substrate 152 is arranged opposite the array substrate 150. The light shielding layer 160 and the counter electrode 162 are arranged on the counter substrate 152. FIG. 5 shows a structure in which the light shielding layer 160 is arranged, for example, in the region overlapping the source electrode 174A (data signal line 109). The counter electrode 162 has a size that extends over the entire surface of the display region 112. The light shielding layer 160 may be formed of a metal film, as described above, and is arranged in contact with the counter electrode 162, which is formed of a transparent conductive layer, thereby functioning as an auxiliary electrode. The counter substrate 152 is arranged with a second alignment film (not shown) that is formed to cover the counter electrode 162.

The liquid crystal layer 126 is arranged between the array substrate 150 and the counter substrate 152. The liquid crystal layer 126 is formed of the polymer-dispersed liquid crystal. The polymer-dispersed liquid crystal can be used in either normal mode, in which it changes from a scattering state to a non-scattering state (transparent), or reverse mode, in which it changes from a non-scattering state (transparent) to a scattering state, depending on the state in which voltage is applied to the second transparent conductive layer 184 as the pixel electrode. Since the polymer dispersed liquid crystal does not require a polarizing plate, the display panel 102 can be seen through in the non-scattered state (transparent), allowing the back side to be viewed.

1-5. Wiring Patterns

The details of the first wiring pattern 118 and the second wiring pattern 120 are described next with reference to FIG. 6A, FIG. 6B, and FIG. 6C.

Figure 6A:
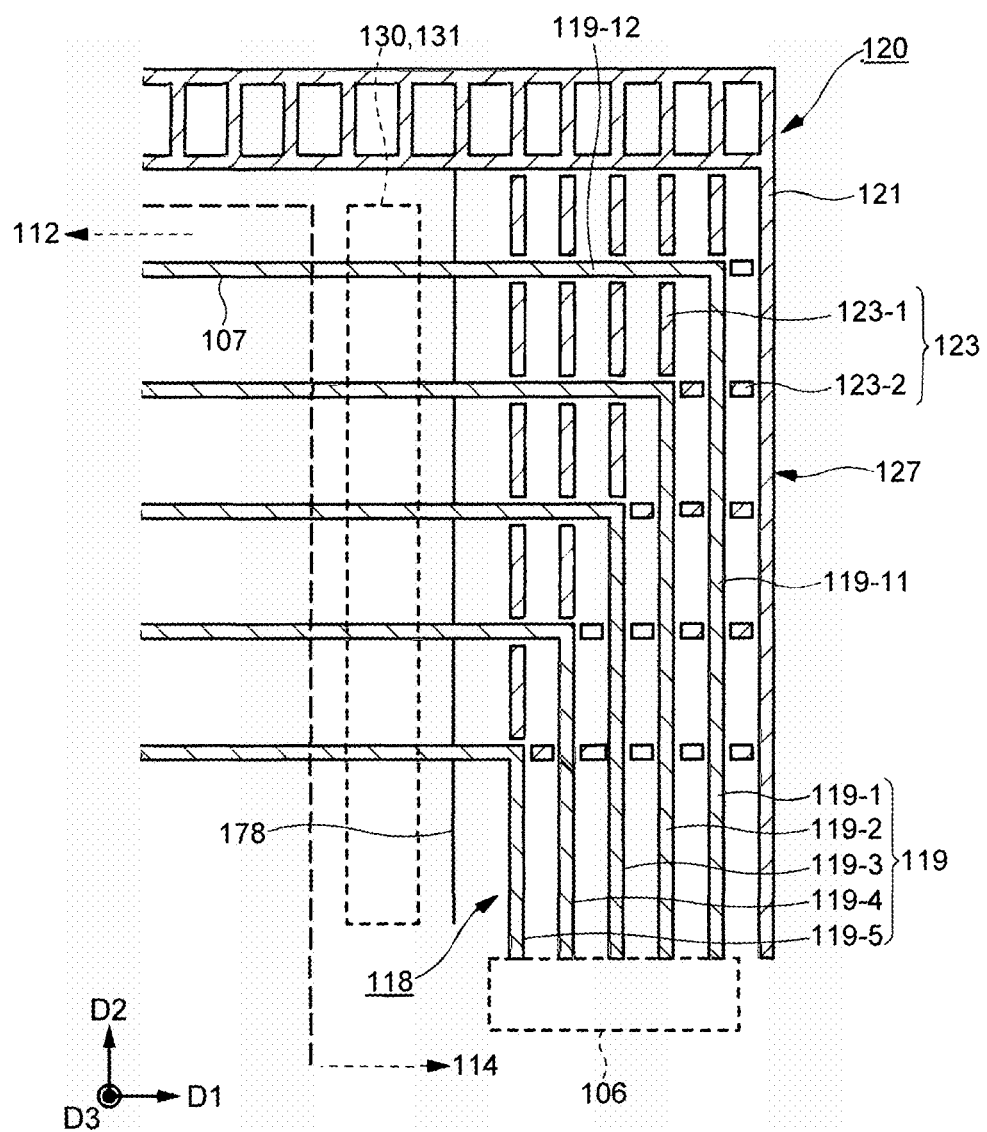
FIG. 6A is a plan view showing a configuration of wirings arranged in a peripheral region of a display device according to an embodiment of the present invention.

FIG. 6A shows the first wiring pattern 118 and the second wiring pattern 120 arranged on the array substrate 150. The first wiring pattern 118 and the second wiring pattern 120 are arranged in the peripheral region 114. The first wiring pattern 118 includes first wirings 119 that connect the scanning signal line driver circuit 106 and the scanning signal lines 107. The second wiring pattern 120 includes a second wiring 121 where the common potential is applied.

The first wirings 119 are arranged appropriately according to the number of scanning signal lines 107. FIG. 6A shows, as an example, a plurality of first wirings 119-1, 119-2, 119-3, 119-4, and 119-5. Focusing on the first wiring 119-1, the first wiring 119-1 includes a first straight portion 119-11 extending in the direction D2 and a second straight portion 119-12 extending from one end of the first straight portion 119-11 in the direction D1 and connected to the scanning signal line 107. Since the direction D1 and direction D2 are orthogonal, the first wiring 119-1 has a shape in which one wiring is bent 90 degrees in the middle. While the other plurality of first wirings 119-2, 119-3, 119-4, and 119-5 have similar shapes, since the scanning signal lines 107 are spaced apart in the direction D2, the position of the bend of the first wiring 119 changes in the direction from the upper right to the lower left in the drawing.

The second wiring pattern 120 has a third grid pattern 127 in the region adjacent to the display region 112. In other words, the second wiring 121 is formed in the third grid pattern 127. As described in FIG. 3, the second wiring pattern 120 is arranged to extend from one end of the array substrate 150 to the other end of the array substrate 150. Although a common potential is applied to the second wiring 121 forming the second wiring pattern 120, the wiring resistance is reduced by having the third grid pattern 127.

Dummy wirings 123 are arranged in the first wiring pattern 118 to form a grid pattern similar to the second wiring pattern 120. The dummy wirings 123 are arranged between the wirings of the first wiring 119 and between the first wirings 119 and the second wiring 121. The dummy wirings 123 include a plurality of first dummy wirings 123-1 extending in the direction D2 and arranged in the direction D1, and a plurality of second dummy wirings 123-2 extending in the direction D1 and arranged in the direction D2.

The plurality of first dummy wirings 123-1 and the plurality of second dummy wirings 123-2 are arranged apart so as not to be connected to the first wirings 119. The plurality of first dummy wirings 123-1 are disposed spaced apart in the direction D1 to have the same spacing as the grid of the second wiring pattern 120. As noted above, the first wiring pattern 118 and the second wiring pattern 120 form the third grid pattern 127. In particular, the plurality of second dummy wirings 123-2 are arranged apart in the direction D2 so as to form a part of the third grid pattern 127 together with the second straight wiring portion 190-12 of the first wirings 119. Thus, the first wiring pattern 118 forms a part of the third grid pattern 127 with the first wiring 119 and the dummy wiring 123. Although the first wirings 119 and the dummy wirings 123 forming the first wiring pattern 118 and the second wiring 121 configuring the second wiring pattern 120 are not mutually connected, they can be seen as having the third grid pattern 127 from a bird's-eye view.

Figure 6B:
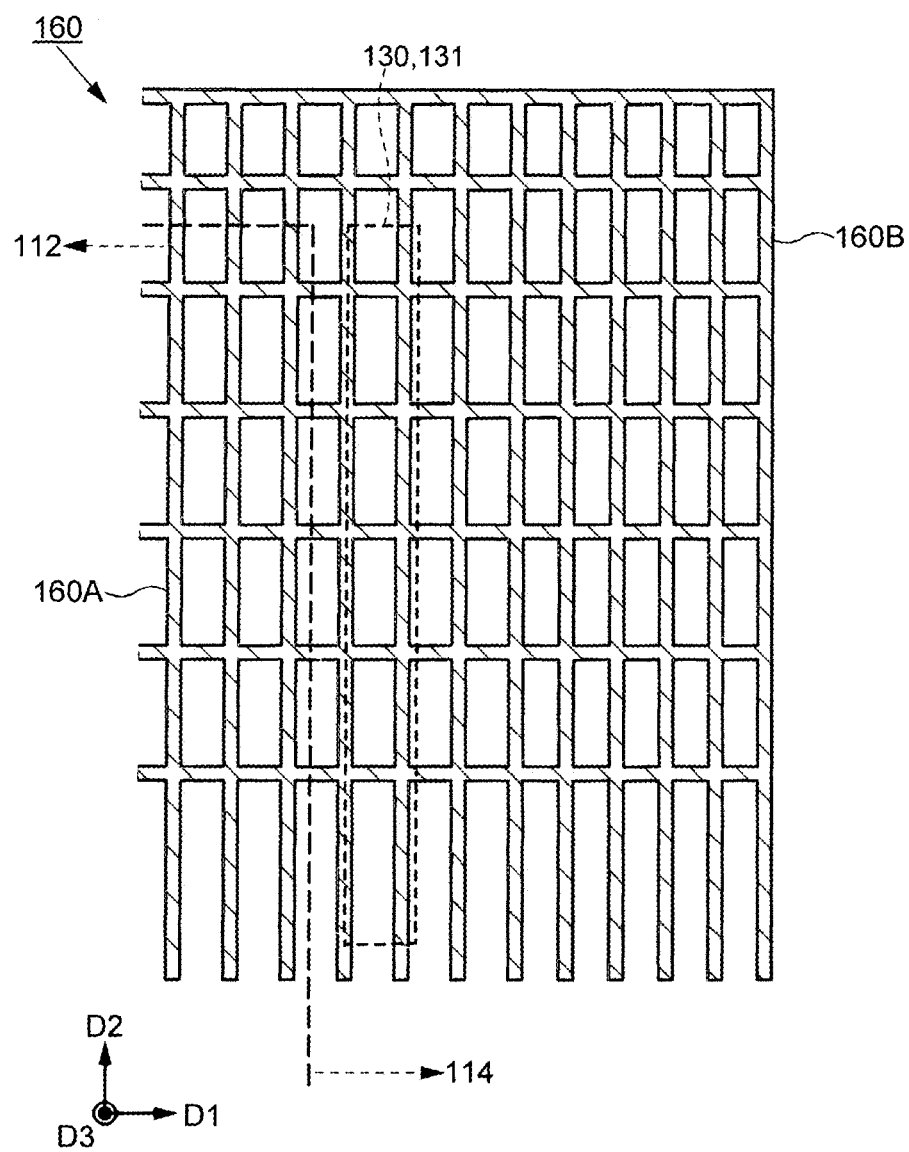
FIG. 6B is a plan view showing a configuration of a light shielding layer arranged in a peripheral region of a display device according to an embodiment of the present invention.

FIG. 6B shows a pattern of the light shielding layer 160 on the counter substrate 152. As described with reference to FIG. 4, the light shielding layer 160 has the first grid pattern 160A in the display region and the second grid pattern 160B in the peripheral region 114. The first grid pattern 160A overlaps the display signal lines 109 and the scanning signal lines 107 in the display region 112. The second grid pattern 160B overlaps the first wiring pattern 118 and the second wiring pattern 120-2 in the peripheral region 114. The light shielding layer 160 is arranged to overlap the first wirings 119 and dummy wirings 123 forming the first wiring pattern 118 and the second wiring 121 forming the second wiring pattern 120. The light shielding layer 160 can cover the first wiring pattern 118 and the second wiring pattern 120 formed with a metal film in the peripheral region 114. It is possible to make an aperture ratio (ratio of light-shielding areas and light-transmitting areas per unit area) the same or comparable to that of the light shielding layer 160 in the display region 112, by having the light shielding layer 160 have a continuous grid pattern from the display region 112 to the peripheral region 114. Thereby, it is possible to prevent any difference in transparency between the display region 112 and the peripheral region 114, so that these two regions can be distinguished from each other and not be visible.

Figure 6C:
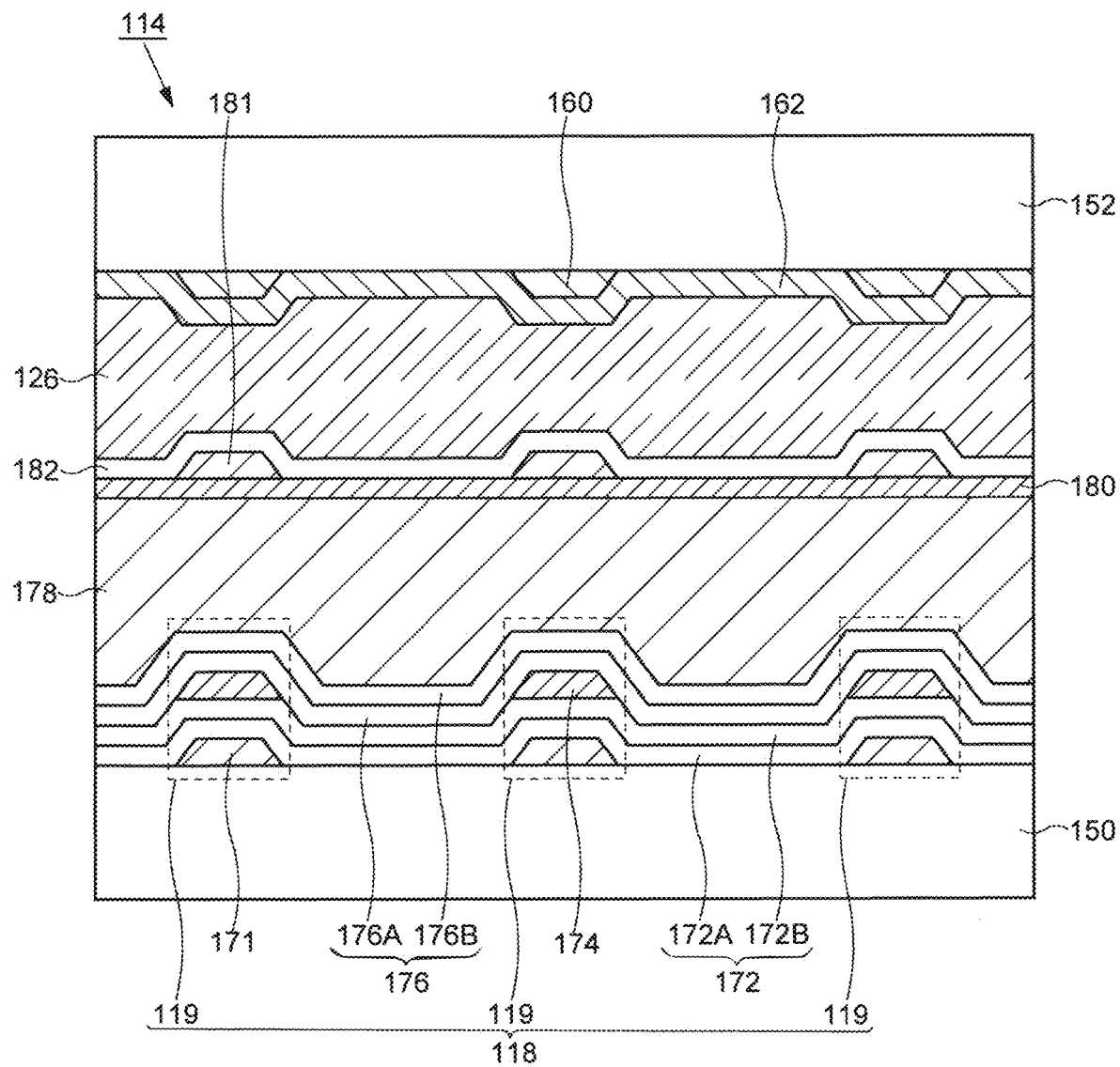
FIG. 6C is a cross-sectional view showing a configuration of wirings and a light shielding layer arranged in a peripheral region of a display device according to an embodiment of the present invention.

FIG. 6C is a cross-sectional view of the peripheral region 114 and shows the cross-sectional structure of the first wiring pattern 118. As shown in FIG. 6C, the first wirings 119 on the array substrate 150 side are formed by the first conductive layer 171 and the second conductive layer 174. Although a first insulating layer 172 is arranged between the first conductive layer 171 and the second conductive layer 174, the first conductive layer 171 and the second conductive layer 174 may be connected by contact holes at any position not shown in the diagram. The dummy wirings 123 are also formed by the same first conductive layer 171 and second conductive layer 174 as the first wirings 119.

The first conductive layer 171 and the second conductive layer 174 are formed of metallic films. The metallic films are formed of metallic materials such as aluminum, titanium, molybdenum, or other conductive metallic compounds such as titanium nitride. Although not shown in detail in FIG. 6C, the first conductive layer 171 and the second conductive layer 174 may be made of a plurality of metal films. For example, the first conductive layer 171 may have an aluminum layer and a titanium layer stacked on top of each other. The second conductive layer 174 may have a structure in which a titanium layer sandwiches the top and bottom of the aluminum layer, and a titanium nitride layer may be formed on the outside of the aluminum layer.

The first wirings 119 are embedded by the planarization layer 178, and the first transparent conductive layer 180 is arranged as a shield layer thereon. The first transparent conductive layer 180 is arranged to spread over the entire region where the first wiring pattern 118 and the second wiring pattern 120 are arranged. A fourth conductive layer 181 is arranged in contact with the first transparent conductive layer 180. Although not shown in FIG. 6C, the fourth conductive layer 181 has a grid pattern overlapping the first wirings 119. The fourth conductive layer 181 may have a grid pattern that overlaps the second grid pattern 160B of the light shielding layer 160. The fourth conductive layer 181 is arranged in contact with the first transparent conductive layer 180, which is arranged as a shielding layer, and has a function as auxiliary wiring to reduce the resistance loss of the shielding layer.

The light shielding layer 160 of the counter substrate 152 is arranged so that it overlaps the first wirings 119. The counter electrode 162 is arranged to cover the light shielding layer 160. Since the peripheral region 114 is not an image display region, the counter electrode 162 is not essential, however, it can be arranged in the same manner as the display region 112 so that there is no difference in transparency (or transmittance) between the display region 112 and the peripheral region 114. The liquid crystal layer 126 in the peripheral region 114 is sandwiched between the first transparent conductive layer 180 as a shield layer and the counter electrode 162, and since both are fixed at a constant potential, the alignment state of the liquid crystal layer 126 is not affected and the non-scattering state (transparent) can be maintained.

The same wiring pattern can be formed for the wiring group extending in the first direction (scanning signal lines 107) and the wiring group extending in the second direction (data signal lines 109) as for the display region 112, by forming the first wiring 119 (wiring connecting the scanning signal line driver circuit 106 and the scanning signal line 107) that forms the first wiring pattern 118 with a wiring portion extending in the first direction (D1 direction) and a wiring portion extending in the second direction (D2 direction) and the second wiring 121 (common wiring) that forms the second wiring pattern 120 in the same way, with a wiring portion extending in the first direction (D1 direction) and a wiring portion extending in the second direction (D2 direction), in the peripheral region 114. As a result, it is possible to prevent a difference in visibility (transparency) between the display region 112 and the peripheral region 114 in terms of external light reflection.

It is possible to make the boundary between the wiring drawn from the scanning signal lines 107 and the common wiring unnoticeable by forming the first wiring pattern 118 and the second wiring pattern 120 in the same pattern. It is possible to prevent a difference in visibility (transparency) between the display region 112 and the peripheral region 114 by arranging a light shielding layer 160 having a grid pattern in both the display region 112 and the peripheral region 114.

Second Embodiment

This embodiment shows a different structure of the peripheral region 114 in the display device 100 shown in the first embodiment.

Figure 7A:
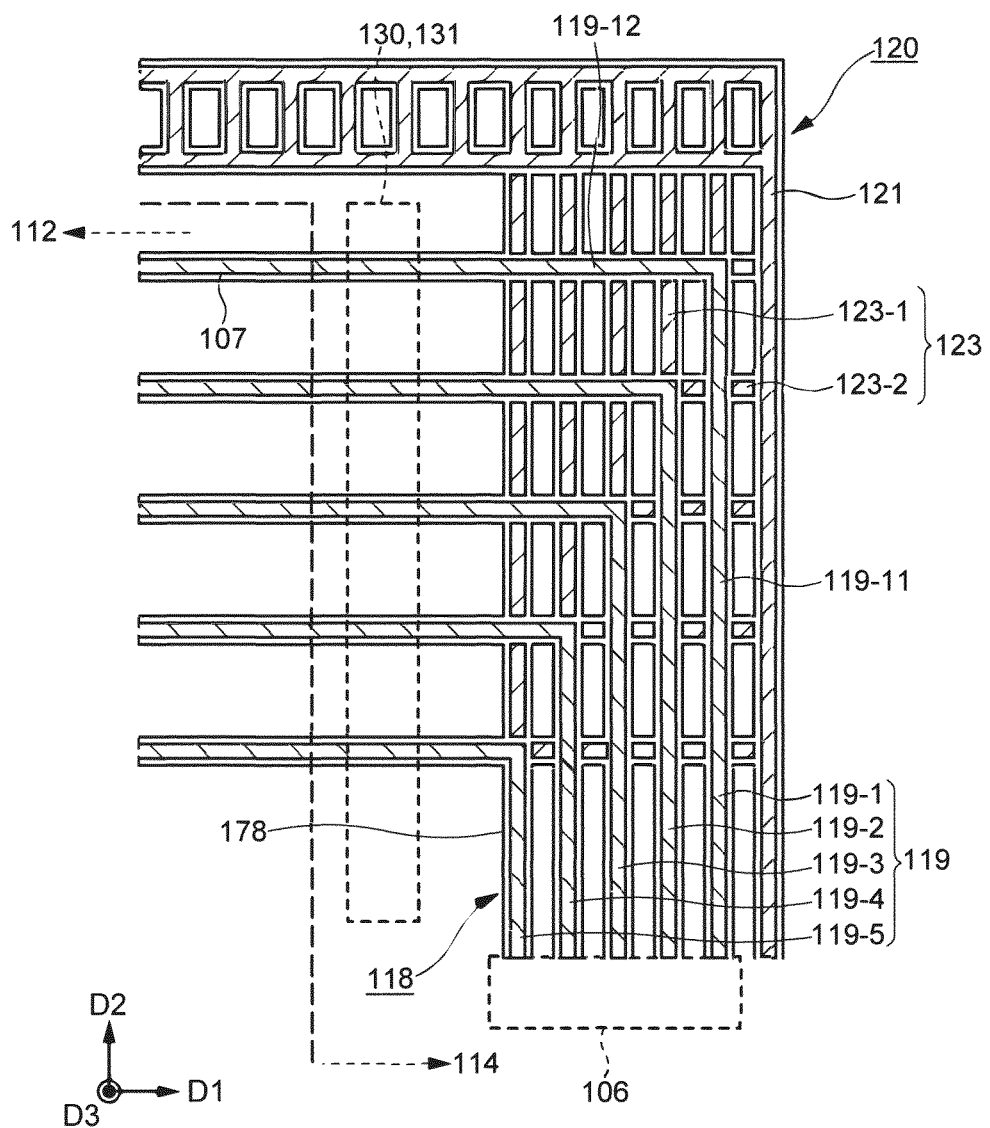
FIG. 7A is a plan view showing a configuration of wirings and a planarization layer arranged in the peripheral region of a display device according to an embodiment of the present invention.
Figure 7B:
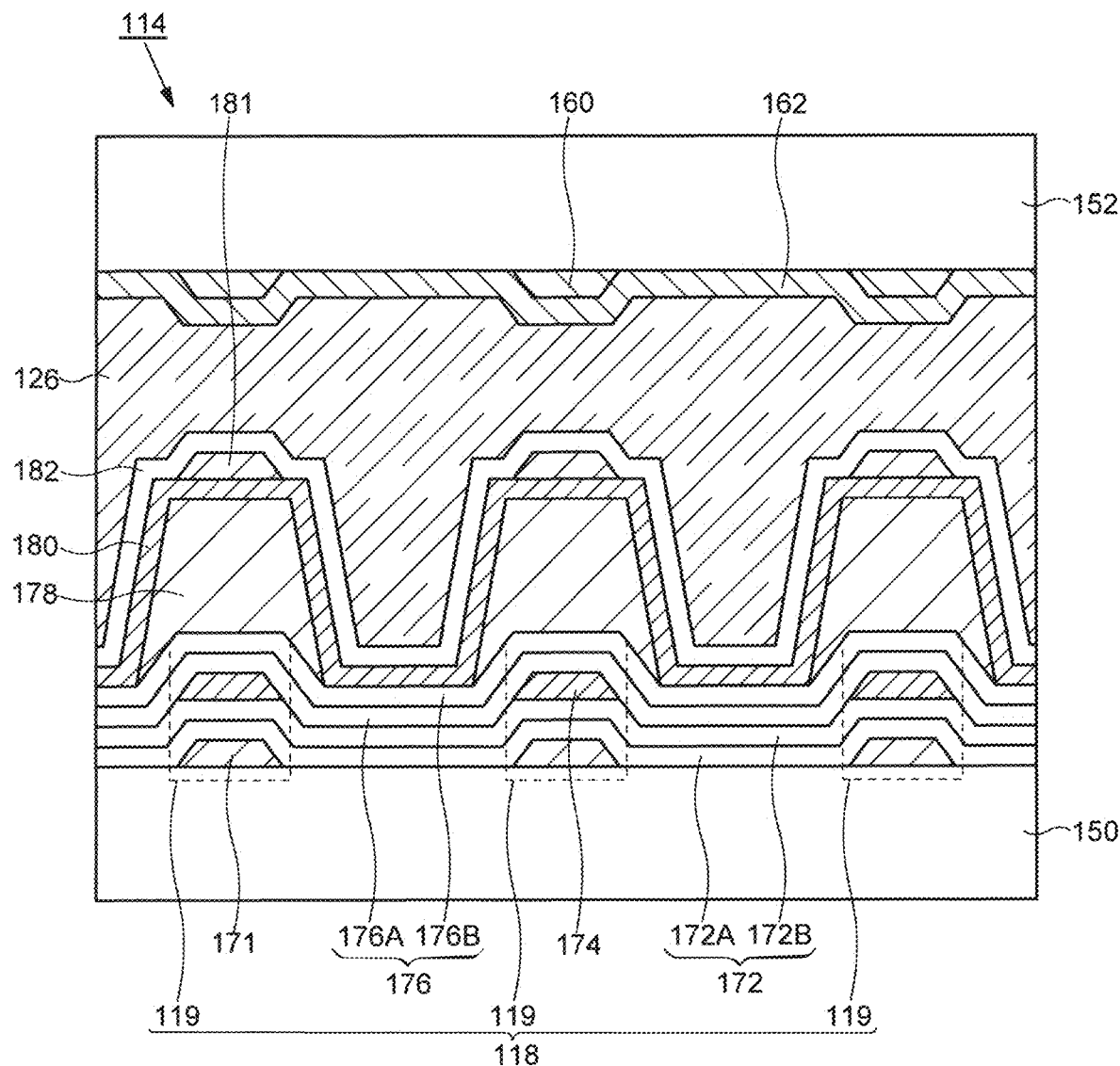
FIG. 7B is a cross-sectional view showing a configuration of wirings, a planarization layer, and a light shielding layer arranged in the peripheral region of a display device according to an embodiment of the present invention.

FIG. 7A shows a plan view of the first wiring pattern 118 and the second wiring pattern 120 arranged on the array substrate 150, and FIG. 7B shows a cross-sectional view of the peripheral region 114. The first wiring pattern 118 has the same structure as in the first embodiment. The dummy wirings 123 also have the same configuration as in the first embodiment. The first wirings 119 and dummy wirings 123, and the second wiring 121 are arranged on the planarization layer 178, and the planarization layer around them is removed. As shown in FIG. 7A, the planarization layer 178 in the region surrounded by the first wirings 119 (119-1 to 119-5), dummy wirings 123 (123-1, 123-2), and the second wiring 121 is removed, in the peripheral region 114. As shown in FIG. 7B, the first transparent conductive layer 180 covers the top and sides of the planarization layer 178 and is arranged along the top surface of the second insulating layer 176 in the region where the planarization layer is removed.

Figure 8:
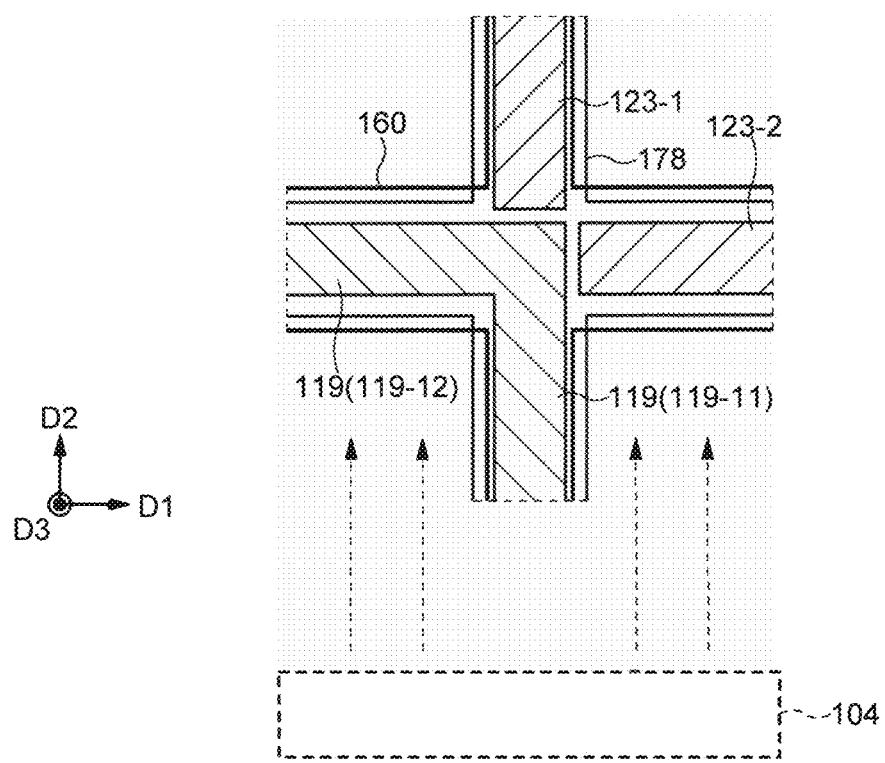
FIG. 8 is a plan view showing a configuration of wirings, a planarization layer, and a light shielding layer arranged in a peripheral region of a display device according to an embodiment of the present invention.

As described in FIG. 1 and FIG. 2, the light emitted from the light source 104 is incident from the side of the counter substrate 152. As shown in FIG. 8, when the light is emitted from the light source 104 in the direction D2, if the planarization layer 178 between the wirings is removed, there is concern that the light may scatter at the edges and cause light leakage. FIG. 8 shows a structure in which the first straight portion 119-11 of the first wiring 119 is arranged in the direction D2 and the second straight portion 119-12 in the direction D1. Corresponding to such a wiring pattern, the planarization layer 178 also has a pattern removed along the direction D1 and direction D2. The portion of the pattern of the planarization layer 178 that extends in the direction parallel to the direction D2 is parallel to the direction of the light emitted from the light source 104, so there is no effect of scattering at the edges. On the other hand, the portion of the pattern of the planarization layer 178 that extends in the direction that intersects the direction D2 (direction D1) intersects the direction of the light emitted from the light source 104, so there is concern regarding the effect of scattering at the edges.

To solve this problem, as shown in FIG. 8, the pattern of the light shielding layer 160 is different between the portion extending in the direction of D1 and the portion extending in the direction of D2. That is, the pattern of the light shielding layer 160 is widened in the portion extending in the direction of D1 relative to the portion extending in the direction of D2. Specifically, the portion extending in the direction D1 is wider than the width of the planarization layer 178. Thus, it is possible to reduce the effect of light leakage by arranging the width of the light shielding layer 160 extending in the direction D1 so that it covers the edge of the planarization layer 178. On the other hand, with respect to the direction D2, since the effect of scattering at the edge of the planarization layer 178 need not be considered, the light shielding layer 160 need only be wide enough to cover the first wiring 119, and the edge of the planarization layer 178 extending in the direction D2 may be exposed from the light shielding layer 160.

FIG. 8 is a schematic enlarged portion, and as shown in FIG. 7A, the length of the first wiring 119 is shorter in the direction D1 than in the direction D2. Therefore, even if the width of the pattern extending in the direction D1 of the light shielding layer 160 is widened, the decrease in the aperture ratio is slight, rather, the narrowing of the width of the pattern extending in the direction D2 is expected to improve the aperture ratio. Even if the planarization layer 178 between the wirings is removed in the first wiring pattern 118 and the second wiring pattern 120, the aperture ratio of the light shielding layer 160 can be increased while preventing light leakage by making the pattern width of the light shielding layer 160 different in the direction D1 and the direction D2.

According to this embodiment, the peripheral region 114 has a region where the planarization layer 178 is partially removed, similar to the display region 112. This configuration can also reduce the effect of light absorption by the planarization layer 178 in the peripheral region 114. Specifically, the optical absorption on the short wavelength side by the planarization layer 178 is reduced. Thereby, the difference in coloring between the display region 112 and the peripheral region 114 can be prevented from being seen, and the difference in transparency can be prevented. The display device 100 in this embodiment has the same configuration as that in the first embodiment except that the planarization layer 178 is partially removed, and the same advantageous effects can be achieved.

The first and second embodiments described above as embodiments of the present invention may be combined as appropriate, as long as they do not contradict each other. Any addition, deletion, or design change of configuration elements, or any addition, omission, or change of conditions of a process, made by a person skilled in the art based on the liquid crystal display device of each embodiment is also included in the scope of the present invention as long as it has the gist of the invention.

It is understood that other advantageous effects different from the advantageous effects provided by each of the above-described embodiments, which are obvious from the description herein or which can be easily foreseen by those skilled in the art, will naturally be provided by the present invention.

What is claimed is:

1. A display device, comprising:
   an array substrate including a display region arranged with pixels and a peripheral region outside the display region;
   a counter substrate facing the array substrate; and
   a liquid crystal layer between the array substrate and the counter substrate,
   wherein the display region includes a plurality of scanning signal lines extending in a first direction and arranged in a second direction intersecting the first direction, and a plurality of data signal lines extending in the second direction and arranged in the first direction,
   wherein the peripheral region comprises a first wiring pattern formed with a plurality of first wirings connecting the plurality of scanning signal lines and a scanning signal line driver circuit and a plurality of dummy wirings, and a second wiring pattern formed with second wirings to be applied with a certain potential,
   wherein each of the plurality of first wiring portions has a first straight portion extending in the second direction, a second straight portion extending in the first direction from an end of the first straight portion and connected to one of the plurality of scanning signal lines, and
   wherein the plurality of dummy wirings includes:
      a plurality of first dummy wirings arranged only in the region between the respective second straight portions of the plurality of first wirings and extending in the second direction and arranged spaced apart in the first direction, and
      a plurality of second dummy wirings arranged only in the region between the respective first straight portions of the plurality of first wirings and extending in the first direction and arranged in the second direction.

2. The display device according to claim 1, wherein the counter substrate includes a light shielding layer, and
   wherein the light shielding layer has a first grid pattern overlapping the plurality of data signal lines and the plurality of scanning signal lines in the display region and a second grid pattern overlapping the first wiring pattern and the second wiring pattern in the peripheral region.

3. The display device according to claim 2, wherein the first grid pattern and the second grid pattern are continuous.

4. The display device according to claim 1, wherein:
   the array substrate includes a planarization layer extending over the display region and the peripheral region,
   the pixel includes a pixel electrode and a transistor connected to the pixel electrode, and is arranged in the region where the planarization layer is removed, and
   the first wiring pattern and the second wiring pattern are embedded in the planarization layer.

5. The display device according to claim 4, wherein the planarization layer is removed around the plurality of first wirings, the plurality of dummy wirings, and the second wirings.

6. The display device according to claim 5, further comprising a light source arranged along the first direction and emitting light from the side of the counter substrate in the second direction, wherein a width along the first direction of the first grid pattern and the second grid pattern of the light shielding layer is wider than a width along the second direction of the first grid pattern and the second grid pattern of the light shielding layer.

7. The display device according to claim 1, wherein the plurality of first wirings and the plurality of dummy wirings comprises the same conductive layer.

8. The display device according to claim 1, further comprising a light source extending along the first direction and emitting light from a side surface of the counter substrate in the second direction.

9. The display device according to claim 1, wherein the liquid crystal layer is a polymer-dispersed liquid crystal.

10. The display device according to claim 1, wherein the plurality of first dummy wirings has a discontinuous pattern extending in the second direction, and the plurality second dummy wiring has a discontinuous pattern extending in the first direction.

* * * * *